(12) United States Patent
Wallman et al.

(10) Patent No.: US 10,317,440 B2
(45) Date of Patent: Jun. 11, 2019

(54) MOBILE DEVICE TESTER FOR PRECISE INDUCTIVE POWER MEASUREMENT AND CALIBRATION UNIT THEREFOR AND METHOD THEREFOR

(71) Applicant: nok9 AB, Malmö (SE)

(72) Inventors: Joakim Wallman, Malmö (SE); Martin Neckmar, Bara (SE)

(73) Assignee: NOK9 ip AB, Malmo (SE)

( * ) Notice: Subject to any disclaimer, the term of this patent is extended or adjusted under 35 U.S.C. 154(b) by 400 days.

(21) Appl. No.: 14/974,693

(22) Filed: Dec. 18, 2015

(65) Prior Publication Data

US 2016/0178676 A1    Jun. 23, 2016

(30) Foreign Application Priority Data

Dec. 19, 2014   (SE) ........................................ 1451610

(51) Int. Cl.

| | |
|---|---|
| *G01R 21/133* | (2006.01) |
| *H04B 5/00* | (2006.01) |
| *H02J 50/12* | (2016.01) |
| *G01R 21/00* | (2006.01) |
| *G01R 31/40* | (2014.01) |
| *G01R 31/28* | (2006.01) |
| *H02J 7/02* | (2016.01) |

(52) U.S. Cl.
CPC ............ *G01R 21/133* (2013.01); *H02J 50/12* (2016.02); *H04B 5/0037* (2013.01); *H04B 5/0081* (2013.01); *G01R 31/2839* (2013.01); *G01R 31/40* (2013.01); *H02J 7/025* (2013.01)

(58) Field of Classification Search
CPC .............................. G01R 21/133; H02J 50/12
USPC ............................................................ 702/61
See application file for complete search history.

(56) References Cited

U.S. PATENT DOCUMENTS

| | | | |
|---|---|---|---|
| 2011/0133763 A1* | 6/2011 | Schulte ................. | G05B 17/02 324/750.01 |
| 2011/0196544 A1 | 8/2011 | Baarman et al. | |
| 2011/0204901 A1* | 8/2011 | Mockenhaupt ....... | H02J 3/1828 324/601 |
| 2012/0206113 A1* | 8/2012 | Kogel ................. | H02M 1/4258 323/207 |
| 2012/0326658 A1 | 12/2012 | Kim et al. | |
| 2013/0026847 A1 | 1/2013 | Kim et al. | |
| 2014/0001877 A1 | 1/2014 | Stevens et al. | |
| 2016/0178676 A1* | 6/2016 | Wallman ................. | H02J 50/12 702/61 |
| 2016/0301262 A1* | 10/2016 | Patino ..................... | H02J 7/025 |
| 2017/0279306 A1* | 9/2017 | Elad ........................ | H02J 50/12 |
| 2017/0324484 A1* | 11/2017 | Saada ................. | H04B 1/1027 |
| 2018/0041047 A1* | 2/2018 | Partovi ................... | H01F 5/003 |

FOREIGN PATENT DOCUMENTS

| | | |
|---|---|---|
| WO | 2012109610 A1 | 8/2012 |
| WO | 2014060871 A1 | 4/2014 |

OTHER PUBLICATIONS

Extended European Search Report for European patent application No. 15201227.4, dated Apr. 6, 2016.

\* cited by examiner

*Primary Examiner* — Caleb E Henry
(74) *Attorney, Agent, or Firm* — Honigman LLP; Anna M. Budde

(57) ABSTRACT

A test unit for testing the inductive charging capabilities of a mobile device and a method therefore is provided. Moreover, a calibrator unit for calibrating the test unit is provided.

16 Claims, 3 Drawing Sheets

MOBILE DEVICE TESTER FOR PRECISE INDUCTIVE POWER MEASUREMENT AND CALIBRATION UNIT THEREFOR AND METHOD THEREFOR

CROSS-REFERENCE TO RELATED APPLICATIONS

This application claims priority under 35 U.S.C. § 119 to Swedish patent application No. SE 1451610-8, filed Dec. 19, 2014, the entire contents of which are incorporated herein by reference.

TECHNICAL FIELD

The present invention relates to a test unit for testing the inductive charging capabilities of a mobile device. More particularly, the present invention relates to a test unit with a precisely calibrated power output for testing the inductive charging capabilities of a mobile device.

BACKGROUND

In order to assess the inductive power charging capabilities of a mobile device, such as a mobile phone or smart phone, a test unit is used.

A problem of conventional test unit is that the accuracy of the inductive power transmitted by such a test unit in use, is poor.

Hence, an improved test unit would be advantageous.

SUMMARY

According to an aspect a test unit for testing inductive power charging of a mobile device, with a precisely calibrated power output, is provided. The test unit comprises an electrical circuit being powered by a DC power source, the circuit being capable of generating electrical power at each of a number of frequencies f, the electrical circuit comprising a primary transmitter coil for inductively transmitting power to a secondary receiver coil of the mobile device in use, and a capacitor connected in series with the primary transmitter in order to get a resonance circuit with resonance at a certain frequency. The test unit further comprises a control unit configured to operate in a calibration mode and a testing mode. In the power calibration mode the control unit is configured to:
receive a measurement of a voltage U supplied over the primary transmitter coil;
receive a measurement of a current I flowing through the primary transmitter coil;
and for at least one power frequency f:
derive in a state where no secondary receiver coil is inductively connected to the primary transmitter coil:
a time compensation parameter Δt(f) compensating for phase shift in the signal paths in the electrical circuit between the measured voltage U and the measured current I, such that the inductive power transmitted from the primary transmitter coil being a product of U and I integrated over a period equals zero by time compensating either of the measured U or measured I with the time compensation parameter, and store the time compensation parameter Δt(f) in a memory, and
a voltage amplification constant $K_{U\text{-}MDT}(f)$ using an external voltmeter measuring a reference voltage over the primary transmitter coil, such that the voltage amplification constant $K_{U\text{-}MDT}(f)$ multiplied by the measured voltage U equals the reference voltage for each power frequency,
receive, in a state where a secondary receiver coil of a calibrator unit is inductively connected to the primary transmitter coil, a signal containing data comprising information of actual inductive power transmitted from the primary transmitter coil $P_{TX\text{-}ACTUAL}(f)$ from the calibrator unit; and
derive a current amplification constant $K_{I\text{-}MDT}(f)$ required for the calculated inductive power transmitted from the primary transmitter coil $P_{TX}(f)$ to be equal to that of the actual inductive power transmitted $P_{TX\text{-}ACTUAL}(f)$ for each power frequency, and store the amplification constant in a memory.

According to another aspect, a calibrator unit for calibrating a test unit is provided. The calibrator comprises an electrical circuit having a secondary receiver coil for receiving electrical power of a certain frequency from a primary transmitter coil of the test unit in use, and a resistor connected in series with the secondary receiver coil and having a well defined resistance $R_{CAL}$. The calibrator unit further comprises a calibrator control unit configured to:
for at least one power frequency
receive a voltage measurement $U_{CAL}(f)$ over the resistor,
calculate the actual inductive power received by the secondary receiver coil $P_{TX\text{-}ACTUAL}(f)$ based on the measured voltage and resistance of the resistor by using Ohm's Law, and
transmit a signal, containing data comprising information of the calculated actual electrical power $P_{TX\text{-}ACTUAL}$ received by the secondary receiver coil, to the test unit in use.

According to yet another aspect, a method for testing inductive power charging of a mobile device, using a test unit having a precisely calibrated power output and operating in a calibration mode is provided. The method comprises:
measuring a voltage U supplied over a primary transmitter coil of the test unit;
measuring a current I flowing through the primary transmitter coil;
and for at least one power frequency f:
a state where no secondary receiver coil is inductively connected to the primary transmitter coil:
deriving a time compensation parameter Δt(f) compensating for phase shift in the signal paths of the test unit between the measured voltage U and the measured current I, such that the inductive power transmitted from the primary transmitter coil being a product of U and I integrated over a period equals zero by time compensating either of the measured U or measured I with the time compensation parameter, and
deriving a voltage amplification constant $K_{U\text{-}MDT}(f)$ using an external voltmeter measuring a reference voltage over the primary transmitter coil, such that the voltage amplification constant $K_{U\text{-}MDT}(f)$ multiplied by the measured voltage U equals the reference voltage for each power frequency,
receiving, in a state where a secondary receiver coil of a calibrator unit is inductively connected to the primary transmitter coil, a signal containing data comprising information of actual inductive power transmitted from the primary transmitter coil $P_{TX\text{-}ACTUAL}(f)$ from the calibrator unit;

deriving a current amplification constant $K_{I\text{-}MDT}(f)$ required for the calculated inductive power transmitted from the primary transmitter coil $P_{TX}(f)$ to be equal to that of the actual inductive power transmitted $P_{TX\text{-}ACTUAL}(f)$ for each power frequency, and store the amplification constant in a memory.

An advantage according to some embodiments is that a very precise power output measurement is achieved by the test unit. This allows for a very accurate quality assessment of the inductive power charging capability of a mobile device when connected to the test unit.

BRIEF DESCRIPTION OF THE DRAWINGS

In order to explain the invention, a number of embodiments of the invention will be described below with reference to the drawings, in which.

DESCRIPTION OF EMBODIMENTS

A general idea of the present invention is to provide a test unit for testing inductive power charging of a mobile device, wherein the test unit has a precisely calibrated power output. In a calibration mode the test unit calculates a number of constants required for determining the precisely calibrated output. Hence, after the execution of the calibrating mode, the test unit is capable of calculating its inductive power output, regardless of the type of secondary receiver coil of any device being inductively connected thereto. In a testing mode, the test unit calculates the power output when a mobile device is inductively connected thereto, and compares this calculated output to the measurement values of the received inductive power sent by the mobile device to determine a quality assessment of the inductive power measuring capability of the mobile device.

The expression "test unit" may throughout the present specification also be referred to as a mobile device test (MDT) unit being used for testing the inductive power charging capability of a mobile device.

The expression "mobile device" may throughout the present specification be a mobile terminal, such as a mobile phone, or smartphone, being capable of inductive charging.

Figure 1:
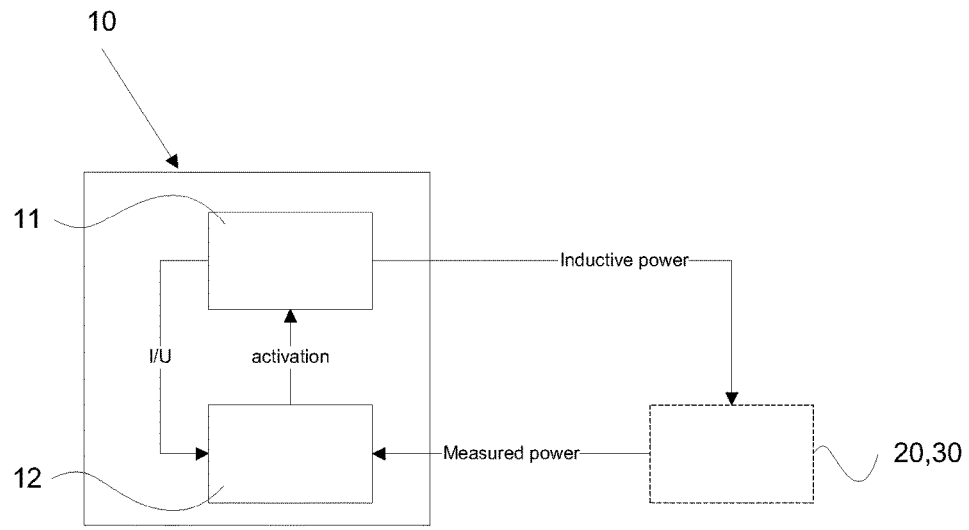
FIG. 1 is a schematic view of a test unit according to an embodiment.
Figure 2:
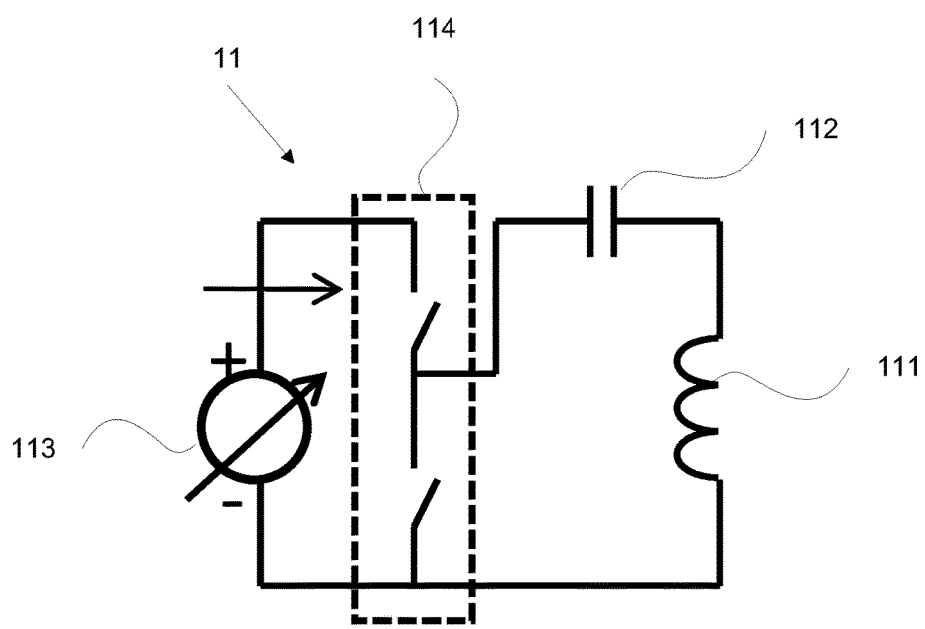
FIG. 2 shows an electrical circuit of a test unit according to an embodiment.

In an embodiment, according to FIGS. 1 and 2, a test unit 10 for testing inductive power charging of a mobile device 30 is provided. The test unit 10 comprises an electrical circuit 11 being powered by a DC power source 113. The circuit is capable of generating electrical power at each of a number of frequencies f. The electrical circuit 11 comprises a primary transmitter coil 111 for inductively transmitting power to a secondary receiver coil of the mobile device in use. The electrical circuit 11 further comprises a capacitor 112 connected in series with the primary transmitter coil in order to get a resonance circuit with resonance at a certain frequency. The test unit 10 further comprises a control unit 12 configured to operate in a calibration mode and a testing mode. The control unit 12 may be a conventional processor with a memory. The control unit is able to store the result of any derived parameter, calculation, and/or processing made into its memory.

Calibration Mode

In the calibration mode the control unit 12 is configured to receive a measurement of a voltage U supplied over the primary transmitter coil 111. The voltage is measured using a high resolution ADC (not shown) over the primary transmitter coil 111. It may be observed from FIG. 2, that a switch configuration 114 creates an AC signal seen on the right of the switch configuration 114 of FIG. 2, from a DC signal seen on the left side originating from the DC power source. The control unit 12 is further configured to receive measurement of a current I flowing through the primary transmitter coil. The current measurement may be measured using a current sense transformer connected to a high resolution ADC (not shown).

In order for the control unit 12 to precisely calculate the inductive power transmitted from the primary transmitter coil 111, it is configured to execute a number of parameters affecting the power output. In a first step, where no secondary receiver coil is operatively coupled to the primary transmitter coil, a time compensation parameter $\Delta t(f)$ is derived for each power frequency f of the power supplied by the power source. The time compensation parameter $\Delta t(f)$ compensates for phase shifts in the signal paths in the electrical circuit 11 between the measured voltage U and the measured current I. The time compensation parameter is derived by time or phase shifting the measured current I in relation to the measured voltage U, such that the integrated product of $I\Delta t(f)$ and U over a period is zero when no secondary receiver coil is inductively coupled to the primary transmitter coil. The control unit is configured to store each time compensation parameter in its memory. The time compensation parameter is required for a mathematical formula used to calculate the inductive power transmitted from the primary transmitter coil.

It should be appreciated that the time compensation parameter $\Delta t(f)$ defines the relation between the measured current I and measured voltage U, such that the integrated product, i.e. the calculated power, of I and U over a period is zero when no secondary receiver coil is inductively coupled to the primary transmitter coil. Hence, either the current is time or phase shifted by the time compensation parameter or the measured voltage could be time or phase shifted. For simplicity and for facilitated understanding of the present specification the measured current I is time compensated by the time compensation parameter, although the scope of the present specification also encompasses the embodiment where the measured voltage could be time compensated.

Using an external voltmeter (not shown), the control unit 12 can determine a voltage amplification constant $K_{U\text{-}MDT}(f)$. The voltage amplification constant $K_{U\text{-}MDT}(f)$ is measured in a state where no secondary receiver coil is inductively coupled to the primary transmitter coil. In an embodiment, the voltage amplification constant attains a single value for each power frequency. However, under some conditions, a mean constant relevant for a number of power frequencies may also be determined for simplicity. The external voltmeter measures the voltage directly over the primary transmitter coil, thereby giving a reference voltage. The voltage amplification constant $K_{U\text{-}MDT}(f)$ is derived such that the product of the voltage measured by the high resolution ADC and the voltage amplification constant $K_{U\text{-}MDT}(f)$ equals the reference voltage for each power frequency. Once each voltage amplification constant $K_{U\text{-}MDT}(f)$ over the range of power frequencies has been derived by the control unit, the external voltmeter is disconnected.

The control unit is further configured to receive a signal containing data comprising information of actual inductive power transmitted from the primary transmitter coil $P_{TX\text{-}ACTUAL}(f)$ from a calibrator unit 20 comprising a secondary receiver coil 211 being inductively coupled to the primary transmitter coil 111 in use.

Using the actual inductive power transmitted from the primary transmitter coil $P_{TX\text{-}ACTUAL}(f)$ the control unit 12 is configured to derive a current amplification constant $K_{I\text{-}MDT}(f)$ when the primary transmitter coil 111 is inductively coupled to the secondary receiver coil 211.

The voltage amplification constant and the current amplification constant derived are required for calculating the inductive power transmitted from the primary transmitter coil $P_{TX}(f)$ such that $P_{TX}(f)$ is equal to $P_{TX\text{-}ACTUAL}(f)$ for the measured voltage U, current I, and time compensation parameter Δt.

In an embodiment, wherein the inductive power transmitted from the primary coil $P_{TX}(f)$ is calculated by using the general following formula (Equation 1):

$$P_{TX}(f) = \int U * K_{U\text{-}MDT}(f) * I\Delta t(f) * K_{I\text{-}MDT}(f) - R_{ESR}(f) * I^2 * K_{I\text{-}MDT}(f)^2$$

Here, U denotes the measured voltage, $K_{U\text{-}MDT}$ denotes the derived voltage amplification constant, $I\Delta t(f)$ denotes the time compensated measured current, $K_{I\text{-}MDT}(f)$ denotes the derived current amplification, and $R_{ESR}(f)$ denotes a known transmitter coil equivalent series resistance for power frequency f, which may be derived by an external instrument. The integral is made over a period of time.

In the event the measured voltage is time compensated instead of the measured current I Equation 1 would be defined as:

$$P_{TX}(f) = \int U\Delta t(f) * K_{U\text{-}MDT}(f) * I * K_{I\text{-}MDT}(f) - R_{ESR}(f) * I^2 * K_{I\text{-}MDT}(f)^2$$

Here, $U\Delta t(f)$ denotes the time compensated measured voltage U.

The current amplification constant $K_{I\text{-}MDT}(f)$ is derived from Equation 1 where $P_{TX}(f)$ is replaced by $P_{TX\text{-}ACTUAL}(f)$. Based on Equation 1 the current amplification constant $K_{I\text{-}MDT}(f)$ may be tuned in for each power frequency when the secondary receiver coil 211 of the calibrator unit 20 is inductively connected to the primary transmitter coil 111 of the test unit 10. Theoretically, the current amplification constant may also be calculated from Equation 1 where $P_{TX}(f)$ is replaced by $P_{TX\text{-}ACTUAL}(f)$.

As may be observed, Equation 1 is based on Ohm's Law P=U*I, but taking into account also the amplification constants, time compensation parameter and the inductive power loss dissipated as heat in the primary transmitter coil. The inductive power loss $P_{LOSS}(f)$ in the primary transmitter coil leading to heat emitted from the primary transmitter coil corresponds to $R_{ESR}(f) * I^2 * K_{I\text{-}MDT}(f)^2$.

In an embodiment, the time compensated measured current Mt(f) may be calculated for the condition the inductive power transmitted is set to zero. Using Equation 1 above and setting $P_{TX}(f)$ to zero gives:

$$I\Delta t(f) = R_{ESR}(f) * I^2 * K_{I\text{-}MDT}(f) / (U * K_{U\text{-}MDT}(f)) \quad \text{(Eqn. 2)}$$

However, in practice, Δt may be varied until $P_{TX}(I)$ is zero.

Testing Mode

Figure 5:
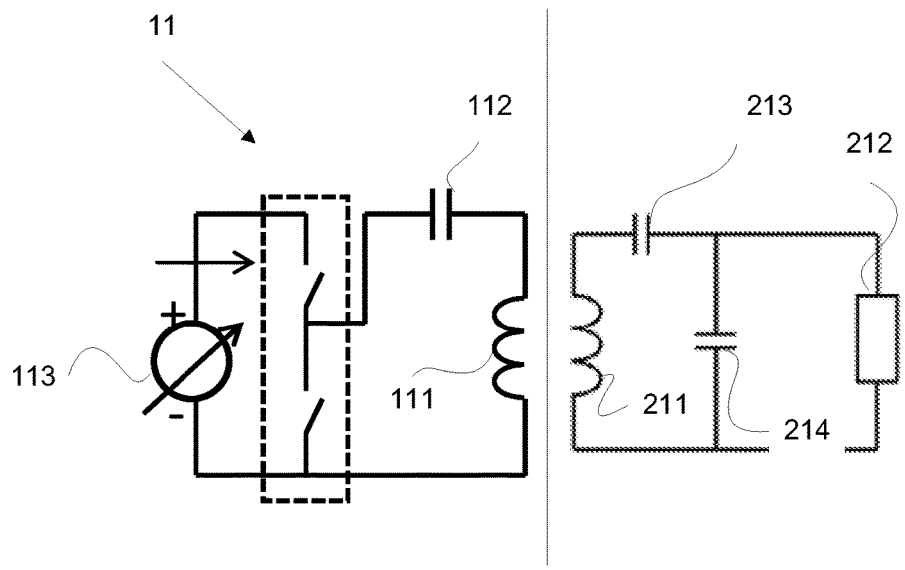
FIG. 5 shows a general electrical circuit of a test unit and the electrical circuit of a calibrator unit when the test unit is inductively coupled to the calibrator unit according to an embodiment.
Figure 6:
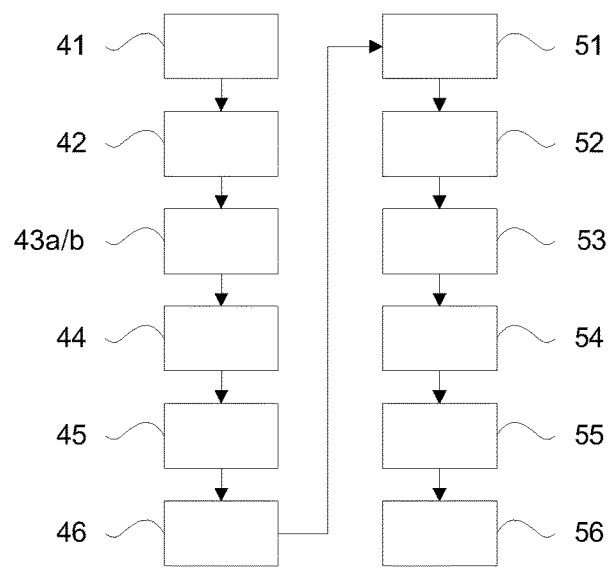
FIG. 6 illustrates a flowchart of a method according to an embodiment.

In the testing mode the control unit is configured to for each relevant power frequency receive a signal containing data comprising information of a measure of received inductive power $P_{RX}(f)$ from a mobile device 30 comprising a secondary receiver coil (not shown) being inductively coupled to the primary transmitter coil 111 in use, e.g. similarly to that the secondary inductor coil 211 in FIG. 5.

In this with the mobile device inductively coupled state, the control unit is configured to receive a further measurement of a voltage U supplied over the primary transmitter coil and a further measurement of a current I flowing through the primary transmitter coil 111. Moreover, the control unit is configured to calculate the power $P_{TX}(f)$ transmitted from the primary transmitter coil 111 using Equation 1.

Furthermore, the control unit 12 is configured to determine a quality assessment of the inductive power charging capability of the mobile device 30 by comparing the calculated inductive power transmitted from the primary transmitter coil $P_{TX}(f)$ with the received inductive power $P_{RX}(f)$. The quality assessment may be transmitted in a signal to an external unit, e.g. processing unit with memory. In the event the received inductive power $P_{RX}(f)$ differs from the calculated inductive power $P_{TX}(f)$ by more that a predetermined degree or threshold, a decision is made that the mobile device does not meet the requirements for inductive power charging certification. The decision may be made by the control unit of the test unit or by the external unit.

Sampling

In an embodiment, the test unit 10 is configured to sample the voltage measurements over a predefined period, in order to derive an average rms voltage during said time period. In this embodiment, the average rms voltage U is used by the control unit in the calculations and the associated equations rather than discrete voltage measurements received by the control unit.

In an embodiment, the test unit 10 is configured to sample the current measurements over a predefined period, in order to derive an average rms current during said time period. In this embodiment, the average rms current I is used in the calculations, and in the equations associated therewith, being executed by the control unit rather than discrete current measurements.

Polynomials

Depending on the configuration of the electrical circuit of the device, e.g. mobile device or calibrator, receiving inductive power from the primary transmitter coil, the inductive power transmitted to said device and the power frequency thereof will vary. In order to take this into consideration, in some situations, it may not be feasible to use one of the derived time compensation measured current $I\Delta t(f)$ values, time compensated measured voltage $U\Delta t(f)$, current amplification constants $K_{I\text{-}MDT}(f)$, or voltage amplification constants $K_{U\text{-}MDT}(f)$.

Instead, a first continuous polynomial function relating any power frequency to the time compensation may be generated by the control unit, e.g. by interpolating the discrete time compensation parameters calculated by the control unit in the calibration mode. Hence, in an embodiment the control unit is further configured to generate a first polynomial function describing the relation between any power frequency and a corresponding time compensation Δt(f).

Also, a second continuous polynomial function relating any power frequency to a current amplification constant may be generated by the control unit, e.g. by interpolating the discrete current amplification parameters calculated by the control unit in the calibration mode. Hence, in an embodiment the control unit is configured to generate a second polynomial function describing the relation between current amplification constant $K_{I\text{-}MDT}(f)$ and the power frequency.

Calibrator Unit

Figure 3:
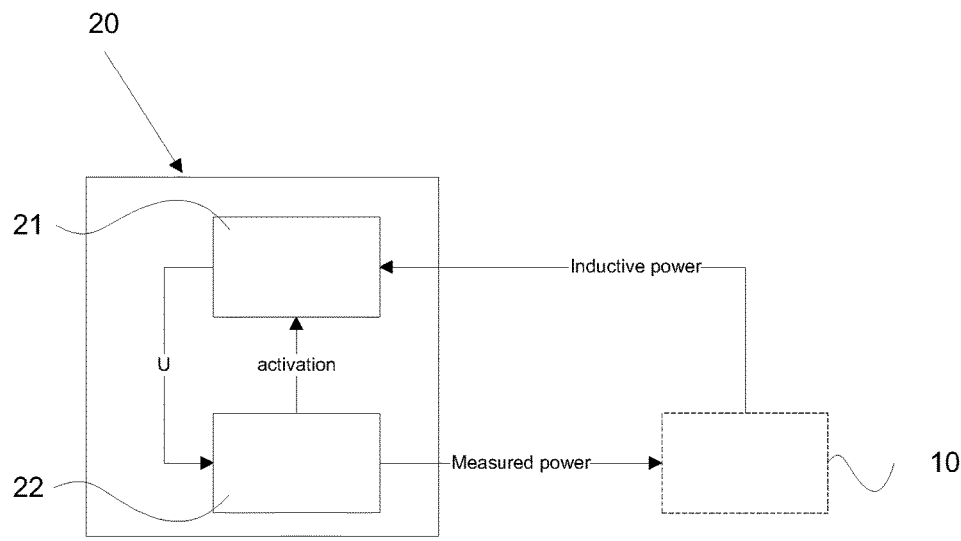
FIG. 3 is a schematic view of a calibrator unit according to an embodiment.
Figure 4:
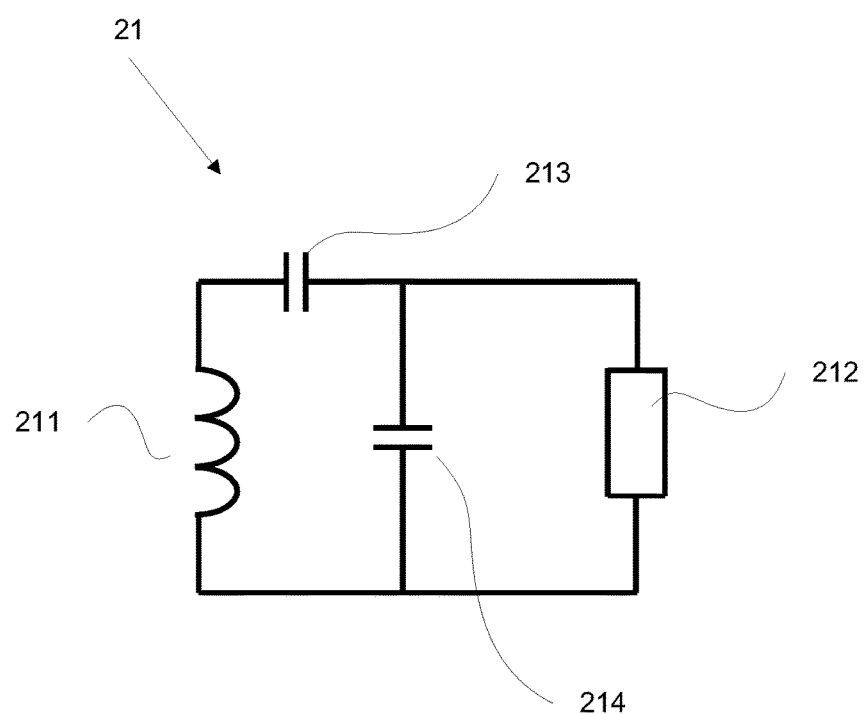
FIG. 4 shows an electrical circuit of a calibrator unit according to an embodiment.

In an embodiment, with reference to FIGS. 3 and 4, a calibrator unit 20 for calibrating a test unit 10 is provided. The calibrator 20 comprises an electrical circuit 21 comprising a secondary receiver coil 211 for receiving electrical power of a certain frequency from a primary transmitter coil of the test unit 10 in use. The electrical circuit 21 further comprises a resistor 212 connected in series with the secondary receiver coil and having a well defined resistance $R_{CAL}$. Moreover, the calibrator unit 20 comprises a calibrator control unit 22. The calibrator control unit may comprise a processor and a memory. The calibrator control unit 22 is configured to, for each power frequency of the inductive power received, receive a voltage measurement of $U_{CAL}(f)$ over the precision resistor 212. The measured voltage $U_{CAL}(f)$ may be conducted by means of a high resolution ADC, similarly to that of the test unit. In order to derive a voltage amplification constant $K_{U\text{-}CAL}(f)$ and for calibrating the ADC measurement, an external voltmeter (not shown) may be connected to the precision resistor 212. Hence, the voltage amplification constant is derived such that the product of $K_{U\text{-}CAL}(f)$ and the voltage measured by the ADC is equal to the reference voltage measured by the voltmeter. The calibrator control unit 22 is further configured to calculate the actual inductive power $P_{TX\text{-}ACTUAL}(f)$ received by the secondary receiver coil 211 based solely on the measured voltage and resistance of the resistor by using Ohm's Law. Moreover, the calibrator control unit 22 is configured to transmit a signal, containing data comprising information of the calculated actual electrical power $P_{TX\text{-}ACTUAL}$ received by the secondary receiver coil, to the test unit 10 in use.

In an embodiment, the actual electrical power received by the secondary receiver $P_{TX\text{-}ACTUAL}(f)$ is calculated using the following formula:

$$P_{TX\text{-}ACTUAL}(f) = U_{CAL}(f)^2 * K_{U\text{-}CAL}(f)^2 / R_{CAL}$$

FIG. 5 shows a general electrical circuit 11 of a test unit 10 and the electrical circuit 21 of a calibrator unit 20 when the test unit 10 is inductively coupled to the calibrator unit 20 according to an embodiment.

In an embodiment, in accordance with FIG. 5, a method 40 for testing inductive power charging of the mobile device 30, using the test unit 10 having a precisely calibrated power output is provided. Steps 41 thru 46 relates to the calibration mode of the test unit 10. The method comprises the steps of:

measuring 41 a voltage U supplied over a primary transmitter coil of the test unit 10;

measuring 42 a current I flowing through the primary transmitter coil;

and for at least one power frequency f:
  in a state where no secondary receiver coil is inductively connected to the primary transmitter coil 111:
    deriving 43a a time compensation parameter $\Delta t(f)$ compensating for phase shift in the signal paths of the test unit 10 between the measured voltage U and the measured current I, such that the inductive power transmitted from the primary transmitter coil being a product of U and I integrated over a period equals zero by time compensating either of the measured U or measured I with the time compensation parameter, and optionally storing 43b the time compensation parameter $\Delta t(f)$ in a memory, deriving 44 a voltage amplification constant $K_{U\text{-}MDT}(f)$ using an external voltmeter measuring a reference voltage over the primary transmitter coil 111, such that the voltage amplification constant $K_{U\text{-}MDT}(f)$ multiplied by the measured voltage U equals the reference voltage, receiving 45 a signal containing data comprising information of actual inductive power transmitted from the primary transmitter coil $P_{TX\text{-}ACTUAL}(f)$ from a calibrator unit 20 comprising a secondary receiver coil 211 being inductively coupled to the primary transmitter coil 111 in use;

deriving 46 a current amplification constant $K_{I\text{-}MDT}(f)$ required for the calculated inductive power transmitted from the primary transmitter coil $P_{TX}(f)$ to be equal to that of the actual inductive power transmitted $P_{TX\text{-}ACTUAL}(f)$ for each power frequency, and store the amplification constant in a memory.

The steps 51 thru 56 relates to the calibration mode of the test unit 10. Hence, the method further comprises the steps of:

for each relevant power frequency:
  receiving 51 a signal containing data comprising information of a measure of received inductive power $P_{RX}(f)$ from a mobile device (30) comprising a secondary receiver coil 31 being inductively coupled to the primary transmitter coil 111 in use;

receiving 52 a measurement of a voltage U supplied over the primary transmitter coil;

receiving 53 a measurement of a current I flowing through the primary transmitter coil 111;

calculating 54 an inductive power transmitted from the primary transmitter coil $P_{TX}(f)$ using one of the two following formulae:

$$P_{TX}(f) = U\Delta t(f) * K_{U\text{-}MDT}(f) * I * K_{I\text{-}MDT}(f) - R_{ESR}(f) * I^2 * K_{I\text{-}MDT}(f)^2, \text{ wherein}$$

$K_{U\text{-}MDT}$ denotes the derived voltage amplification constant, $U\Delta t(f)$ denotes the time compensated measured voltage U, I denotes the measured current, $K_{I\text{-}MDT}(f)$ denotes the derived current amplification, and $R_{ESR}(f)$ denotes a known transmitter coil equivalent series resistance for power frequency f, or $$P_{TX}(f) = U * K_{U\text{-}MDT}(f) * I\Delta t(f) * K_{I\text{-}MDT}(f) - R_{ESR}(f) * I^2 * K_{I\text{-}MDT}(f)^2, \text{ wherein}$$

$K_{U\text{-}MDT}$ denotes the derived voltage amplification constant, $I\Delta t(f)$ denotes the time compensated measured current I, U denotes the measured voltage, $K_{I\text{-}MDT}(f)$ denotes the derived current amplification, and $R_{ESR}(f)$ denotes a known transmitter coil equivalent series resistance for power frequency f, comparing 55 the received power $P_{RX}(f)$ with the calculated inductive power transmitted from the primary transmitter coil $P_{TX}(f)$ to determine a quality assessment of the inductive power charging capability of the mobile device for each power frequency, and transmitting 56 a signal comprising information of the quality assessment of the inductive power charging capability of the mobile device.

What is claimed is:

1. A test unit for testing inductive power charging of a mobile device, with a precisely calibrated power output, comprising an electrical circuit being powered by a DC power source, said circuit being capable of generating electrical power at each of a number of frequencies f, the electrical circuit comprising
a primary transmitter coil for inductively transmitting power to a secondary receiver coil of the mobile device in use, and
a capacitor connected in series with the primary transmitter coil in order to get a resonance circuit with resonance at a certain frequency, and
a control unit configured to operate in a power calibration mode and a testing mode, wherein the control unit in the power calibration mode is configured to:
receive a measurement of a voltage U supplied over the primary transmitter coil;
receive a measurement of a current I flowing through the primary transmitter coil;
and for at least one power frequency f:
derive in a state where no secondary receiver coil is inductively connected to the primary transmitter coil:
a time compensation parameter Δt(f) compensating for phase shift in the signal paths in the electrical circuit between the measured voltage U and the measured current I, such that the inductive power transmitted from the primary transmitter coil being a product of U and I integrated over a period equals zero by time compensating either of the measured U or measured I with the time compensation parameter, and store the time compensation parameter Δt(f) in a memory, and
a voltage amplification constant $K_{U\text{-}MDT}(f)$ using an external voltmeter measuring a reference voltage over the primary transmitter coil, such that the voltage amplification constant $K_{U\text{-}MDT}(f)$ multiplied by the measured voltage U equals the reference voltage for each power frequency,
receive, in a state where a secondary receiver coil of a calibrator unit is inductively connected to the primary transmitter coil, a signal containing data comprising information of actual inductive power transmitted from the primary transmitter coil $P_{TX\text{-}ACTUAL}(f)$ from the calibrator unit; and
derive a current amplification constant $K_{I\text{-}MDT}(f)$ required for a calculated inductive power transmitted from the primary transmitter coil $P_{TX}(f)$ to be equal to that of the actual inductive power transmitted $P_{TX\text{-}ACTUAL}(f)$ for each power frequency, and store the amplification constant in a memory,
whereby the test unit can calculate inductive power transmitted from the primary coil in the testing mode using the time compensation parameter, the voltage amplification constant, and the current amplification constant.

2. The test unit according to claim 1, wherein the inductive power transmitted from the primary coil $P_{TX}(f)$ is calculated by using the following formula:

$$P_{TX}(f)=\int U^{*}K_{U\text{-}MDT}(f)^{*}I\Delta t(f)^{*}K_{I\text{-}MDT}(f)-R_{ESR}(f)^{*}I^{2}{}^{*}K_{I\text{-}MDT}(f)^{2},$$

wherein $K_{U\text{-}MDT}$ denotes the derived voltage amplification constant, IΔt(f) denotes the time compensated measured current I, U denotes the measured voltage, $K_{I\text{-}MDT}(f)$ denotes the derived current amplification, and $R_{ESR}(f)$ denotes a known transmitter coil equivalent series resistance for power frequency f, and wherein the integration is made over a period.

3. The test unit according to claim 1, wherein the inductive power transmitted from the primary coil $P_{TX}(f)$ is calculated by using the following formula:

$$P_{TX}(f)=\int U\Delta t(f)^{*}K_{U\text{-}MDT}(f)^{*}I^{*}K_{I\text{-}MDT}(f)-R_{ESR}(f)^{*}I^{2}{}^{*}K_{I\text{-}MDT}(f)^{2},$$

wherein $K_{U\text{-}MDT}$ denotes the derived voltage amplification constant, UΔt(f) denotes the time compensated measured voltage U, I denotes the measured current, $K_{I\text{-}MDT}(f)$ denotes the derived current amplification, and $R_{ESR}(f)$ denotes a known transmitter coil equivalent series resistance for power frequency f, and wherein the integration is made over a period.

4. The test unit according to claim 2, wherein in the testing mode is configured to:
for each relevant power frequency:
receive a signal containing data comprising information of a measure of received inductive power $P_{RX}(f)$ from a mobile device comprising a secondary receiver coil being inductively coupled to the primary transmitter coil in use;
receive a measurement of a voltage U supplied over the primary transmitter coil;
receive a measurement of a current I flowing through the primary transmitter coil;
calculate the inductive power transmitted from the primary transmitter coil $P_{TX}(f)$, and
compare the received power $P_{RX}(f)$ with the calculated inductive power transmitted from the primary transmitter coil $P_{TX}(f)$ to determine a quality assessment of the inductive power charging capability of the mobile device for each power frequency, and
transmit a signal comprising information of the quality assessment of the inductive power charging capability of the mobile device.

5. The test unit according to claim 2, wherein an inductive power loss $P_{LOSS}(f)$ in the primary transmitter coil is defined by the following formula:

$$P_{LOSS}(f)=R_{ESR}(f)^{*}I^{2}{}^{*}K_{I\text{-}MDT}(f)^{2}.$$

6. The test unit according to claim 1, wherein each voltage measurement is based on a number of voltage samples over a predefined time period.

7. The test unit according to claim 1, wherein each current measurement is based on a number of current samples over a predefined time period.

8. The test unit according to claim 1, wherein the control unit is further configured to:
generate a first polynomial function describing the relation between the time compensation parameters Δt(f) and the power frequency f.

9. The test unit according to claim 1, wherein the control unit is further configured to:
generate a second polynomial function describing the relation between current amplification constant $K_{I\text{-}MDT}(f)$ and the power frequency f.

10. The test unit according to claim 2, wherein the control unit is further configured to:
generate a first polynomial function describing the relation between the time compensation parameters Δt(f) and the power frequency f
and
wherein the time compensation parameter Δt(f) is obtained from the first polynomial function for the purpose of calculating the inductive power transmitted from the primary coil $P_{TX}(f)$.

11. The test unit according to claim 2, wherein the control unit is further configured to:
generate a second polynomial function describing the relation between current amplification constant $K_{I\text{-}MDT}(f)$ and the power frequency f and
wherein the current amplification constant $K_{I-MDT}(f)$ is obtained from the second polynomial function for the purpose of calculating the inductive power transmitted from the primary coil $P_{TX}(f)$.

12. A calibrator unit for calibrating a test unit, the calibrator comprising
an electrical circuit comprising:
   a secondary receiver coil for receiving electrical power of a certain frequency from a primary transmitter coil of the test unit in use,
   a precision resistor connected in series with the secondary receiver coil and having a well defined resistance $R_{CAL}$,
a calibrator control unit configured to:
for at least one power frequency
   receive a voltage measurement $U_{CAL}(I)$ over the resistor,
   calculate the actual inductive power received by the secondary receiver coil $P_{TX-ACTUAL}(f)$ based solely on the measured voltage and resistance of the resistor by using Ohm's Law, and
   transmit a signal, containing data comprising information of the calculated actual electrical power $P_{TX-ACTUAL}$ received by the secondary receiver coil, to the test unit in use.

13. The calibrator unit according to claim 9, wherein the actual electrical power received by the secondary receiver $P_{TX-ACTUAL}(f)$ is calculated using the following formula:

$$P_{TX-ACTUAL}(f) = U_{CAL}(f)^2 * K_{U-CAL}(f)^2 / R_{CAL},$$

wherein $K_{U-CAL}(f)$ denotes a voltage amplification constant derived for the calibrator unit.

14. A method for testing inductive power charging of a mobile device, using a test unit having a precisely calibrated power output and operating in a calibration mode, comprising:
   measuring a voltage U supplied over a primary transmitter coil of the test unit;
   measuring a current I flowing through the primary transmitter coil;
   and for at least one power frequency f:
      in a state where no secondary receiver coil is inductively connected to the primary transmitter coil:
         deriving a time compensation parameter $\Delta t(f)$ compensating for phase shift in the signal paths of the test unit between the measured voltage U and the measured current I, such that the inductive power transmitted from the primary transmitter coil being a product of U and I integrated over a period equals zero by time compensating either of the measured U or measured I with the time compensation parameter, and
         deriving a voltage amplification constant $K_{U-MDT}(f)$ using a an external voltmeter measuring a reference voltage over the primary transmitter coil, such that the voltage amplification constant $K_{U-MDT}(f)$ multiplied by the measured voltage U equals the reference voltage for each power frequency,
      receiving, in a state where a secondary receiver coil of a calibrator unit is inductively connected to the primary transmitter coil, a signal containing data comprising information of actual inductive power transmitted from the primary transmitter coil $P_{TX-ACTUAL}(f)$ from the calibrator unit; and
      deriving a current amplification constant $K_{I-MDT}(f)$ required for the calculated inductive power transmitted from the primary transmitter coil $P_{TX}(f)$ to be equal to that of the actual inductive power transmitted $P_{TX-ACTUAL}(f)$ for each power frequency, and store the amplification constant in a memory,
   whereby the test unit can calculate inductive power transmitted from the primary coil using the time compensation parameter, the voltage amplification constant, and the current amplification constant.

15. The method (40) according to claim 14, when the test unit (100) operates in a testing mode, further comprising the following steps:
for each relevant power frequency:
   receiving (51) a signal containing data comprising information of a measure of received inductive power $P_{RX}(f)$ from a mobile device (30) comprising a secondary receiver coil (31) being inductively coupled to the primary transmitter coil (111) in use;
   receiving (52) a measurement of a voltage U supplied over the primary transmitter coil (111);
   receiving (53) a measurement of a current I flowing through the primary transmitter coil (111);
   calculating (54) an inductive power transmitted from the primary transmitter coil $P_{TX}(f)$ using one of the two following formulae:

$$P_{TX}(f) = \int U\Delta t(f) * K_{U-MDT}(f) * I * K_{I-MDT}(f) - R_{ESR}(f) * I^2 * K_{I-MDT}(f)^2,$$

wherein $K_{U-MDT}$ denotes the derived voltage amplification constant, $U\Delta t(t)$ denotes the time compensated measured voltage U, I denotes the measured current, $K_{I-MDT}(f)$ denotes the derived current amplification, and $R_{ESR}(f)$ denotes a known transmitter coil equivalent series resistance for power frequency f, wherein the integration is made over a period, or $$P_{TX}(f) = \int U * K_{U-MDT}(f) * I\Delta t(f) * K_{I-MDT}(f) - R_{ESR}(f) * I^2 * K_{I-MDT}(f)^2,$$

wherein $K_{U-MDT}$ denotes the derived voltage amplification constant, $I\Delta t(t)$ denotes the time compensated measured current I, U denotes the measured voltage, $K_{I-MDT}(f)$ denotes the derived current amplification, and $R_{ESR}(f)$ denotes a known transmitter coil equivalent series resistance for power frequency f, wherein the integration is made over a period, comparing (55) the received power $P_{RX}(f)$ with the calculated inductive power transmitted from the primary transmitter coil $P_{TX}(f)$ to determine a quality assessment of the inductive power charging capability of the mobile device for each power frequency, and
   transmitting (56) a signal comprising information of the quality assessment of the inductive power charging capability of the mobile device.

16. The test unit according to claim 3, wherein in the testing mode is configured to:
for each relevant power frequency:
   receive a signal containing data comprising information of a measure of received inductive power $P_{RX}(f)$ from a mobile device (30) comprising a secondary receiver coil (31) being inductively coupled to the primary transmitter coil (111) in use;
   receive a measurement of a voltage U supplied over the primary transmitter coil (111);
   receive a measurement of a current I flowing through the primary transmitter coil (111);
   calculate the inductive power transmitted from the primary transmitter coil $P_{TX}(f)$, and compare the received power $P_{RX}(f)$ with the calculated inductive power transmitted from the primary transmitter coil $P_{TX}(f)$ to determine a quality assessment of the inductive power charging capability of the mobile device (30) for each power frequency, and transmit a signal comprising information of the quality assessment of the inductive power charging capability of the mobile device.

\* \* \* \* \*